United States Patent
Mercer et al.

(10) Patent No.: US 10,181,792 B2
(45) Date of Patent: Jan. 15, 2019

(54) SENSOR-LESS BUCK CURRENT REGULATOR WITH AVERAGE CURRENT MODE CONTROL

(71) Applicant: DIALOG SEMICONDUCTOR (UK) LIMITED, London (GB)

(72) Inventors: Mark Mercer, Chandler, AZ (US); Kevin Dowdy, Chandler, AZ (US); Karthik Jayaraman, Chandler, AZ (US)

(73) Assignee: DIALOG SEMICONDUCTOR (UK) LIMITED, London (GB)

( * ) Notice: Subject to any disclaimer, the term of this patent is extended or adjusted under 35 U.S.C. 154(b) by 0 days.

(21) Appl. No.: 15/940,905

(22) Filed: Mar. 29, 2018

(65) Prior Publication Data
US 2018/0219484 A1    Aug. 2, 2018

Related U.S. Application Data

(63) Continuation of application No. PCT/US2017/013828, filed on Jan. 17, 2017.
(Continued)

(51) Int. Cl.
| | |
|---|---|
| *H02M 3/158* | (2006.01) |
| *G05F 3/02* | (2006.01) |
| *G01R 19/00* | (2006.01) |
| *H02M 3/156* | (2006.01) |
| *H02M 1/00* | (2006.01) |

(52) U.S. Cl.
CPC ........ *H02M 3/158* (2013.01); *G01R 19/0092* (2013.01); *G05F 3/02* (2013.01); *H02M 3/156* (2013.01); *H02M 2001/0009* (2013.01); *H03K 2217/0027* (2013.01)

(58) Field of Classification Search
CPC .......... H02M 3/158; H02M 2001/0009; G01R 19/0092; G05F 3/02
See application file for complete search history.

(56) References Cited

U.S. PATENT DOCUMENTS 7,045,993 B1 * 5/2006 Tomiyoshi .......... H02M 3/1588
                                                        323/224
8,937,467 B2    1/2015 Qin
(Continued)

FOREIGN PATENT DOCUMENTS

EP          2952914         12/2015

OTHER PUBLICATIONS

International Preliminary Report on Patentability dated Jan. 4, 2018 from corresponding International Application No. PCT/US2017/013828 filed Jan. 17, 2017.
(Continued)

*Primary Examiner* — Emily P Pham
(74) *Attorney, Agent, or Firm* — Haynes and Boone, LLP.

(57) ABSTRACT

A synchronous buck converter is provided in which a replica transistor has its drain coupled to a drain of the low-side switch transistor. A current sensing amplifier drives a scaled current into the replica transistor such that the drain-to-source voltage of the replica transistor substantially equals the drain-to-source voltage of the low-side switch. The replica transistor is much smaller than the low switch transistor such that the replica transistor's on resistance is higher by a scale factor Kf as compared to the on resistance for the low-side switch transistor.

15 Claims, 8 Drawing Sheets

Related U.S. Application Data

(60) Provisional application No. 62/278,943, filed on Jan. 14, 2016.

(56) References Cited

U.S. PATENT DOCUMENTS

| | | |
|---|---|---|
| 2005/0231177 A1 | 10/2005 | Tateno et al. |
| 2008/0246460 A1 | 10/2008 | Smith |
| 2014/0347078 A1 | 11/2014 | Qin |
| 2015/0333611 A1* | 11/2015 | Lakkimsetti .......... H02M 3/158 323/271 |

OTHER PUBLICATIONS

PCT Search Report and Written Opinion dated May 22, 2017 from corresponding International Application No. PCT/US2017/013828 filed Jan. 17, 2017.

* cited by examiner

SENSOR-LESS BUCK CURRENT REGULATOR WITH AVERAGE CURRENT MODE CONTROL

CROSS-REFERENCE TO RELATED APPLICATIONS

This application is a continuation of International Application No. PCT/US2017/013828, filed Jan. 17, 2017, which claims the benefit of U.S. Provisional Application No. 62/278,943, filed Jan. 14, 2016, the contents of which are hereby incorporated by reference in their entirety.

TECHNICAL FIELD

This application relates to switching power converters, and more particularly to a buck converter with improved indirect sensing of the output current and average current mode control.

BACKGROUND

Switching power converters offer higher efficiency as compared to linear regulators. Although linear regulators are relatively inexpensive, they regulate a lower output voltage from a higher input voltage by simply burning the difference as heat. As a result, a linear regulator typically burns more power than is actually supplied to the load. In contrast, a switching power converter regulates its output voltage by delivering relatively small increments of energy through the cycling of a power switch. The power switch in a switch-mode device is either off or on such that efficiency is markedly improved as compared to linear regulators. Switching power converters are thus typically used to regulate the power supply voltage for a mobile device as the resulting increased efficiency extends battery life.

A common type of switching power converter that may be used to step down an input DC voltage into an output DC voltage is a buck converter. In a buck converter, a power switch coupled to an inductor is cycled on so that an input current is driven into an inductor, which thereby stores energy. When the power switch is cycled off, the stored energy is delivered to a load as an output current from the inductor. Inductors cannot tolerate an abrupt ceasing of their current such that a buck converter requires some means of allowing the inductor to deliver its output current after the power switch is cycled off. In an asynchronous buck converter, a diode becomes forward biased in response to the cycling off of the power switch to allow the inductor to deliver its output current to the load. In contrast, a synchronous buck converter replaces the diode with a low side switch transistor. The power switch is denoted as the high side switch in a synchronous architecture. The lower resistance of the low side switch as compared to a diode provides synchronous buck converters with greater efficiency.

A controller in a synchronous buck converter controls the high side and low side switch cycling to regulate the power delivery to the load. The controller requires some sort of feedback from the load to maintain the desired regulation. It is thus conventional to use a sense resistor in series with the low-side switch to measure the output current and regulate accordingly. But such direct sensing increases power dissipation, size, complexity, and cost. Thus, indirect sensing architectures have been developed in which the drain-to-source voltage of the low-side switch is measured during an on cycle. The controller may then multiply the sensed voltage with a presumed value of the drain-to-source on resistance of the low-switch in that is denoted as an indirect sensing regulation scheme. But there is considerable variation from device to device in the drain-to-source on resistance. Moreover, this resistance also varies with temperature such that indirect sensing switching power converters suffer from inaccurate regulation.

Accordingly, there is a need in the art for improved ways of sensing the load current in a switching power converter.

SUMMARY

To avoid the pitfalls of conventional direct and indirect sensing topologies, a synchronous buck converter is provided in which a replica transistor has its drain coupled to a drain of the low-side switch transistor. A current sensing amplifier drives a scaled current into the replica transistor such that the drain-to-source voltage of the replica transistor substantially equals the drain-to-source voltage of the low-side switch. The replica transistor is much smaller than the low switch transistor such that the replica transistor's on resistance is higher by a scale factor Kf as compared to the on resistance for the low-side switch transistor. The scaled current driven into the replica transistor by the current sense amplifier thus equals I/Kf, where I is the load current conducted through the low-side switch. The resulting sensing of the load current is denoted herein as "sensor-less" in that it avoids the drawbacks discussed above with regard to conventional direct and indirect sensing of the load current.

Advantageously, the buck converter is provided with an average current mode control loop that responds to the scaled current. In particular, the scaled current (or a further scaled version of the scaled current) is sampled at the mid-point of the on-time for the low-side switch. The resulting sampled scaled current drives an error amplifier that in turn drives a pulse-width modulator of the high-side switch. The resulting average current mode control combines the benefits of both voltage mode control and peak current mode control without their drawbacks.

These advantageous features may be better appreciated through a consideration of the detailed description below.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
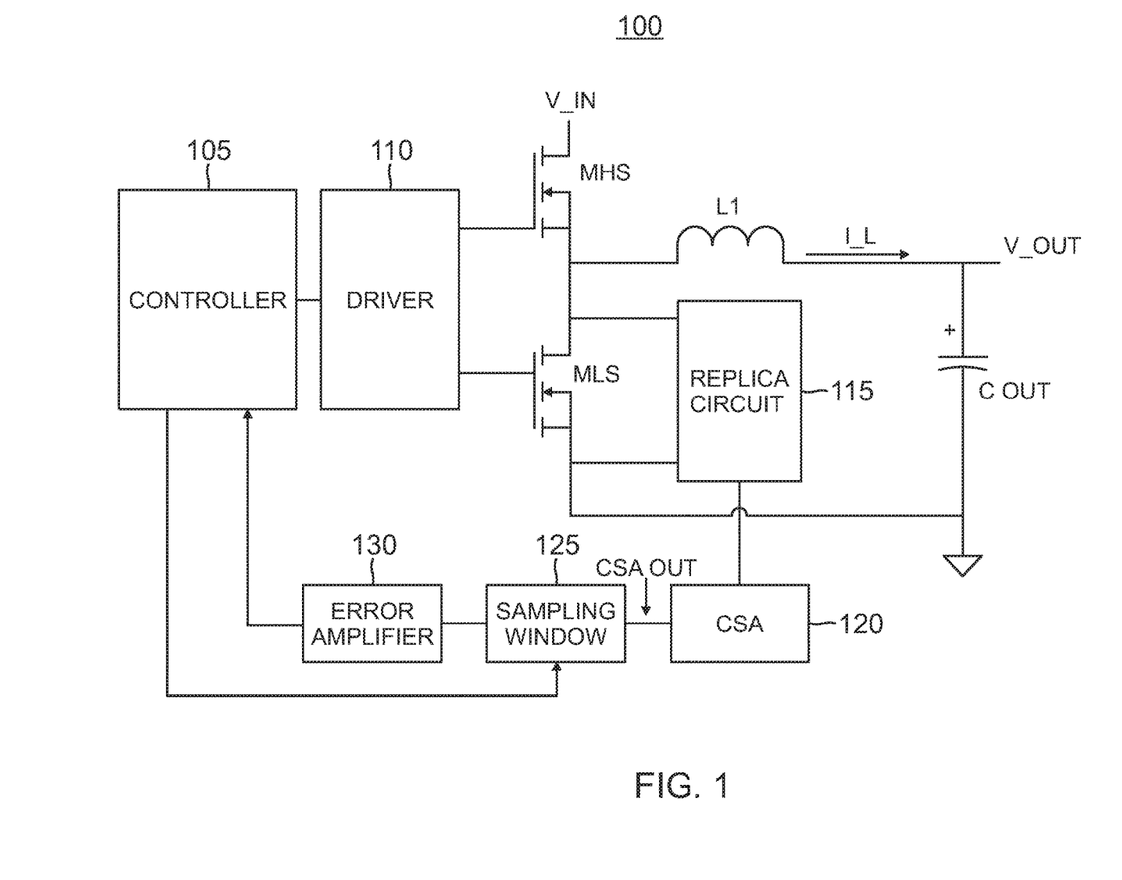
FIG. 1 is a block diagram of an improved buck converter in accordance with an aspect of the disclosure.

Turning now to the drawings, an example buck converter 100 is shown in FIG. 1. An input voltage (V_IN) drives the drain of an NMOS high-side switch transistor (MHS). The source of transistor MHS couples to an inductor L1. When switched-on by a driver circuit 110 as controlled by a controller 105, an inductor current I_L will thus flow through transistor MHS to charge an output capacitor COUT that stores an output voltage (V_OUT) for driving a load (not illustrated). A low-side switch transistor (MLS) has its drain coupled to the source of transistor MHS and its source coupled to ground. When transistor MHS is cycled off, driver 110 drives the gate of transistor MLS to switch it on so that the inductor current I_L may flow through the transistor MLS and inductor L1 to continue to supply power to the load.

Controller 105 regulates the switching of transistors MHS and MLS responsive to a replica of the inductor current I_L flowing through transistor MLS as measured by a replica circuit 115. Driver 110 drives a gate of a replica transistor (not illustrated) within replica circuit 115 with the same drive signal applied to the gate of transistor MLS. A current sense amplifier (CSA) 120 functions to drive the replica transistor with a scaled current of the inductor current I_L such that the drain-to-source voltage of the replica transistor substantially equals the drain-to-source voltage of transistor MLS. With the drain-to-source voltages and gate voltages matched between the transistor MLS and the replica transistor, the current through the replica transistor is thus proportional to the current through transistor MLS.

The replica transistor is much smaller than transistor MLS such that the replica transistor's on resistance is higher by a scale factor Kf as compared to the on resistance for transistor MLS. The scaled current driven into the replica transistor by current sense amplifier 120 thus equals I_L/Kf. CSA 120 also functions to output a current as represented by an output voltage CSAOUT that equals another scaled version of the inductor current I_L. The scaled current from CSA 120 may be converted from a current signal to the output voltage CSAOUT in a current-to-voltage converter (not illustrated) in order to simplify the circuit implementation. The resulting voltage signal CSAOUT is sampled within a sampling window 125 during the on time of transistor MLS to produce a sampled voltage that is compared to a reference voltage by an error amplifier 130 to produce a control voltage output received by controller 105 that represents the average inductor current during the on time of transistor MLS.

Figure 2:
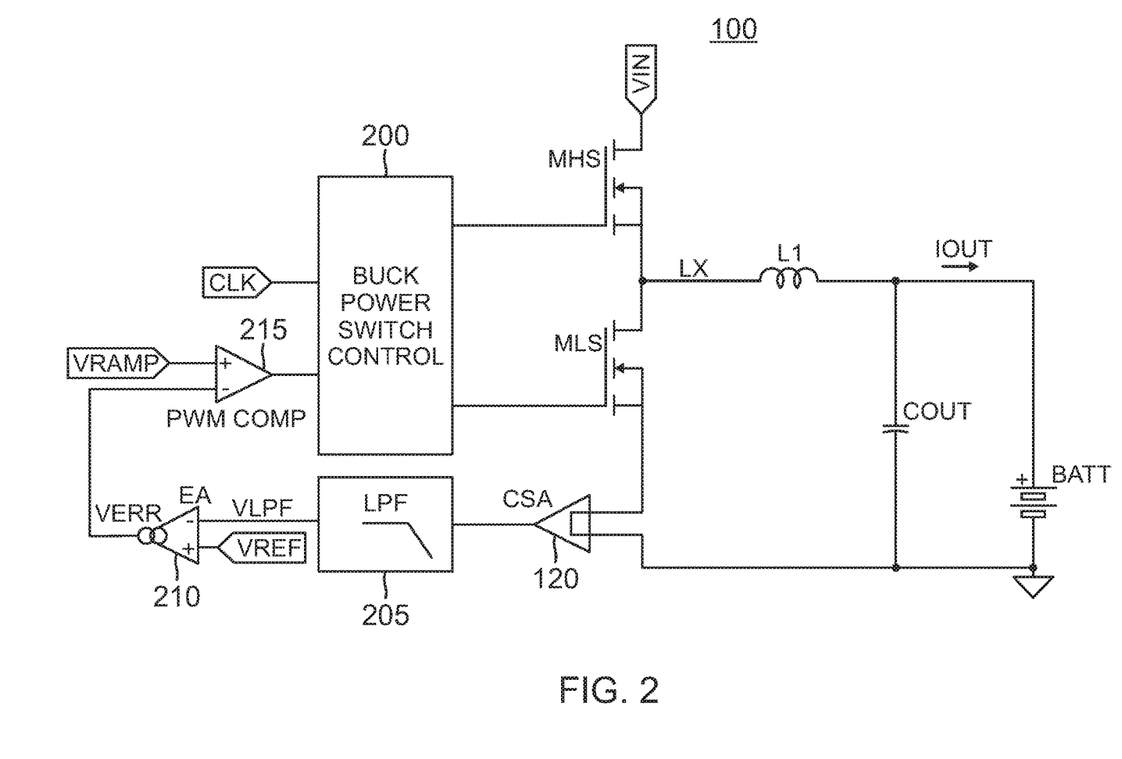
FIG. 2 is a functional block diagram for the buck converter of FIG. 1.

Other functional aspects of buck converter 100 are shown in FIG. 2. Replica circuit 115 is not shown in FIG. 2 for illustration clarity. The scaled current from CSA 120 is converted to a voltage CSAOUT and then low-pass filtered in a low-pass filter (LPF) 205 to provide a low-pass-filtered input voltage VLPF to an error amplifier (EA) 210. EA 210 drives an error voltage VERR responsive to the difference between the input voltage VLPF and a reference voltage VREF such that the error voltage VERR equals A*(VREF−VLPF), where A is the error amplifier gain. A pulse width comparator (PWM COMP) compares the error voltage VERR to a ramped voltage signal VRAMP to produce a comparator output signal. Controller 105 and driver 110 are represented by a buck switch control circuit 200, which responds to the comparator output signal to drive transistors MLS and MI-IS accordingly. A load for buck converter 100 is represented by a battery (BATT) that receives an output current (I_OUT).

Figure 3A:
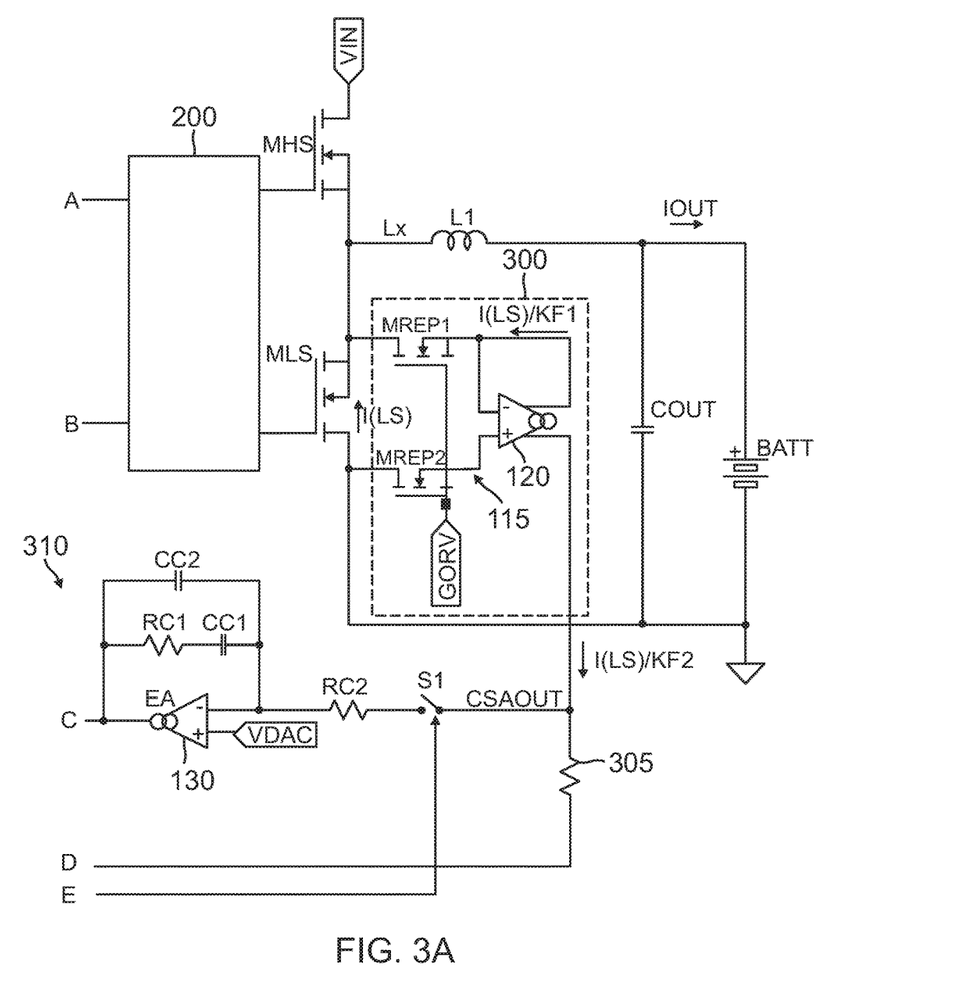
FIGS. 3A and 3B are circuit diagrams of a buck converter embodiment.
Figure 3B:
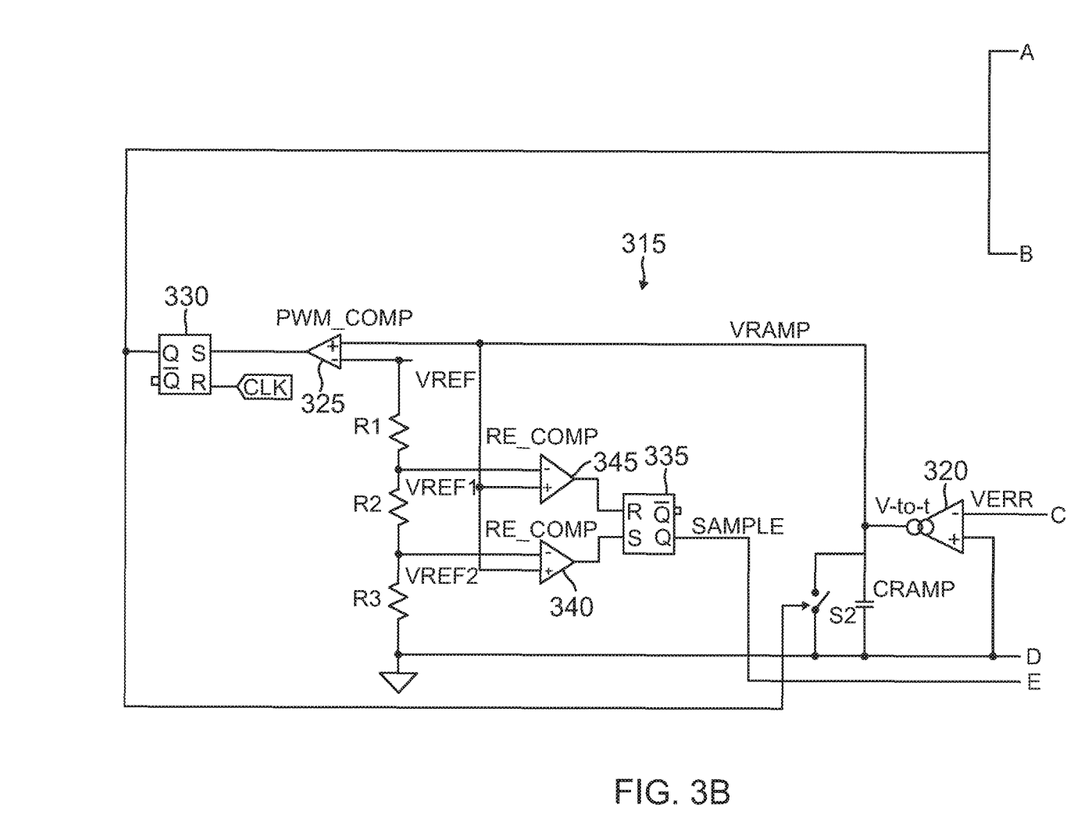

A more detailed circuit diagram for buck converter 100 is shown in FIG. 3A and FIG. 3B. The signal connections between FIGS. 3A and FIG. 3B are denoted by the letters A, B, C, D, and E. Replica circuit 115 and current sense amplifier 120 form a replica circuit 300 that produces a scaled output current I(LS)KF2, where I(LS) is the low-side switch current through transistor MLS. During normal operation of buck converter 100, current I(LS) flows through transistor MLS into a node LX and then into inductor L1. Thus, when transistor MLS is on, the voltage of node LX is negative since the source of transistor MLS is grounded. A first NMOS replica transistor MREP1 has its drain coupled to the drain of transistor MLS and its source coupled to a negative input node for CSA 120. Similarly, a second NMOS replica transistor MREP2 is coupled between the source of transistor MLS and a positive input for CSA 120.

Both replica transistors MREP1 and MREP2 have their gate driven by the same drive signal (GDRV) that drives the gate of transistor MLS. When transistor MLS is thus switched on, the positive input of CSA 120 will thus be grounded through the switched-on replica transistor MREP2. A first output of CSA 120 couples back to the source of replica transistor MREP1 to form a feedback loop. Like other operational amplifiers, CSA 120 functions with the resulting feedback to maintain the voltage of its negative input voltage node equal to its positive input node. The source of replica transistor MREP1 will thus be grounded such that it has the same drain-to-source and gate-to-source voltages as transistor MLS. A current through replica transistor MREP1 thus equals I(LS)/KF1, where KF1 is the scale factor discussed above that results from the size differences between replica transistor MREP1 and transistor MLS. A replica output current from a remaining output node of CSA 120 thus equals I(LS)/KF2, where KF2 is another scaling factor.

A resistor 305 converts the replica output current into the output voltage CSAOUT. For example, resistor 305 may be formed through a serial combination of an internal IC resistor with low temperature sensitivity such as a polysilicon resistor with a diffused resistor. The polysilicon resistor's negative temperature coefficient counteracts the diffused resistor's positive temperature coefficient. This composite resistor exhibits low temperature sensitivity.

A sample switch error amplifier integrator circuit 310 samples output voltage and integrates the error voltage VERR from error amplifier 130. To form the error voltage VERR, error amplifier 130 receives a reference voltage VDAC from a digital-to-analog converter at its positive input (in other embodiments, a bandgap reference voltage may be used to form the reference voltage). Error amplifier 130 forms an integrator in that it receives output voltage through a resistor RC2 at its negative input. The negative input couples to the error amplifier output through a serial combination of an integrating capacitor CC1 and a resistor RC1 as well as through a Miller effect capacitor CC2. The integration across integrating capacitor CC1 forms the low-pass filtering discussed with regard to low-pass filter 205 of FIG. 2. The output voltage CSAOUT is integrated when the sample switch S1 is closed. Since the output voltage is received at the negative input for EA 130 whereas the reference voltage VDAC is received at the positive input for EA 130, the error voltage VERR decreases if the output voltage CSAOUT is greater than the reference voltage VDAC. Conversely, the error voltage VERR increases if the output voltage CSAOUT is less than the reference voltage VDAC. Therefore, sample switch error amplifier integrator circuit 310 acts to regulate the average value of the output voltage CSAOUT to be equal to the reference voltage VDAC. After the sample switch S1 is opened and the AC ripple transients have settled, sample switch error amplifier integrator circuit 310 holds or maintains the value for the error voltage VERR.

A ramp generator and sample pulse generator circuit 315 receives the error voltage at a voltage-to-current (V-to-I) amplifier 320 to drive an output current into a ramp capacitor CRAMP so as to produce a ramp voltage VRAMP across the ramp capacitor CRAMP. This ramp voltage may be reset through a shorting switch S2. A pulse width modulator (PWM) comparator 325 compares the ramp voltage VRAMP to a reference voltage VREF. When the ramp voltage VRAMP exceeds the reference voltage VREF, PWM comparator 325 sets a PWM latch 330. The true data output (Q) of PWM latch 330 goes to the gate driver 200and controls the state of the high side and low side switch transistors MHS and MLS. When the output signal Q is driven high, transistor MHS turns on and transistor MLS turns off. A clock pulse signal (CLK) functions to reset PWM latch 330 every switching cycle. When the clock pulse signal CLK goes high, transistor MHS turns off and transistor MLS turns on.

A serial combination of a resistor R1, R2, and R3 functions to form a voltage divider that divides a scaled and sampled version of the input voltage V_IN (FIGS. 1 and 2) to form the reference voltage VREF as well as a first divided version (VREF1) of the reference voltage VREF and a second divided version (VREF2) of the reference voltage.

The timing for the sample window (the period during which sample switch S1 is closed) is determined by the ramp voltage VRAMP, the first divided reference voltage VREF1 and the second divided reference voltage VREF2. In one embodiment, R3=R1. The value of R2 with respect to R1 and R3 then determines the duration of the sampling window with respect to the off-time of transistor MHS. For example, if R2=R1/2, then the sample window duration will be 20% of the off-time. Having R1 equaling R3 centers the sampling window in the middle of the off-time for transistor MHS. A rising edge comparator 340 functions to set a sample latch 335 when the ramp voltage VRAMP equals the second divided reference voltage VREF2. When sample latch 335 is set, the sample switch S1 is closed as controlled through the Q output of sample latch 335. A falling edge comparator 345 will reset sample latch 335 when VRAMP continues to rise until it equals the first divided reference voltage VREF1, which causes the sample switch S1 to open. The ramp voltage VRAMP will continue to rise until it equals the reference voltage VREF, whereupon PWM comparator 325 will set PWM latch 330 to switch off transistor MLS and switch on transistor MHS. The ramp capacitor CRAMP is discharged by the shorting switch S2 by the setting of latch 330 (whenever the transistor MLS is switched off). It will be appreciated that circuits 300, 305, 310, and 315 are shown separately from buck switch controller 200 for conceptual purposes in that these circuits may be integrated into a controller integrated circuit. The resulting controller integrated circuit may then advantageously control the transistors MLS and MHS as discussed herein.

Since the average inductor current is the regulated parameter, the inductor L1 and the output capacitor COUT do not create a resonant tank in the control loop. This greatly simplifies the design of the compensation for control loop stability. Moreover, the resistor RC in series with the integrating capacitor CC1 forms a zero in the loop transfer function, which counteracts the phase degradation caused by the non-dominant poles in the system. The dominant pole in the control loop is formed by Miller effect capacitor CC2 and the average resistance of the sample switch in series with resistor RC2. This average resistance is inversely proportional to the duty cycle of the on-time of the sample switch with respect to the clock period. The non-dominant poles of the system are due to the bandwidth limitation of CSA 120 an V-to-I stages 305 and 320. The other non-dominant pole is due to the time constant formed by inductor L1 and the resistance of the load. If the load is a battery, then the equivalent series resistance ESR2 for the inductor is the load impedance (assuming that the equivalent series inductance ESL of the battery is much less than L1).

For very high duty cycle operation, controller 105 may transition to a Dropout Mode of regulation. In that regard, most buck regulators that have a NMOS high-side switch rely on a charge pump stage to generate the gate drive for the high-side switch gate driver. This is because the gate voltage must be driven well above the input voltage V_IN in order to fully enhance the high-side switch transistor. The simplest and most effective charge pump architecture uses an external capacitor CBOOT (not illustrated), which is refreshed whenever the transistor MLS is on. When the input and output voltages V_IN and V_OUT of the buck regulator are equal or nearly equal, the control loop will try to keep the transistor MHS on indefinitely. If allowed to do so, then the external capacitor CBOOT will eventually discharge and the high-side gate drive will collapse. In order to prevent this collapse, the control logic typically forces the transistor MLS to turn on for a minimum duration during every switching cycle. This minimum MLS on-time reduces the maximum achievable duty cycle. In order to increase the maximum duty cycle, controller 105 may thus transition into Dropout Mode. If the operating point reaches the minimum MLS on-time condition and the control loop is not in regulation, the error voltage VERR will begin to increase. Once the error voltage VERR increases to a predetermined threshold, the clock frequency will reduce by a predetermined factor. This causes the maximum duty cycle to increase since the minimum MLS on-time is fixed. The error voltage VERR will then reduce to a point where the control loop is in proper regulation. However, if the first reduction in clock frequency is not sufficient to achieve the required duty cycle, the error voltage VERR will increase again. Once the error voltage VERR reaches the dropout threshold again, the clock frequency is reduced by another predetermined factor. If the input voltage V_IN increases, then the error voltage VERR will decrease. If error voltage VERR decreases to a second predetermined threshold, the clock frequency will be increased by some factor. Sufficient hold times may be maintained whenever the clock changes frequency in order to allow the error voltage VERR to settle to its new value. Otherwise, the clock frequency could oscillate between two values.

Unique trim techniques are used to correct for the error sources that can affect the current regulation accuracy of the preferred embodiment. The dominant error contributors are: (1) the ratio mismatch between the replica transistor MREP1 and the transistor MLS; and (2) inherent system delays from the control logic with affect the sample pulse timing. The ratio mismatch error results in a gain error term and the system delays result in an offset term. The gain error may be trimmed by configuring the controller 105 into a test mode such that the transistor MLS is always on and the error voltage VERR is routed to a pad or pin via an analog test bus (not illustrated). The reference voltage VDAC is set to a predetermined voltage. In addition, an external dynamic current sink (not illustrated) is connected to the LX pad (or pin) and ramped or stepped until the error voltage VERR changes state from high to low. The value of the LX current at the point when the error voltage VERR changed state is the current regulation threshold. The reference voltage VDAC is then set to a different voltage and the process is repeated. The difference between the two LX current measurements and the VDAC settings may be used to determine the gain error. The reference voltage VDAC is then trimmed to correct the gain error.

The sample pulse timing error is trimmed by putting controller 105 into a test mode such that the error voltage VERR is internally routed to a pad (or pin). The SAMPLE signal (the Q output from sample latch 335) is routed to a pad/pin via a digital test bus DTB (not illustrated). In this test mode, controller 105 operates as it would in an application with the exception that the error voltage VERR is driven by an external source. The external source is adjusted to achieve the desired duty cycle on the LX node. The SAMPLE signal is compared to the LX pulse waveform. The sample pulse timing error is trimmed by means of digitally programmable delay cells (not illustrated) that are connected in series with the outputs of the rising edge comparator 430 and falling edge comparator 345. The goal is to trim the delay timing such that the time from the falling edge of LX to the rising edge of the SAMPLE signal is exactly equal to the trim from the falling edge of the SAMPLE signal to the rising edge of LX.

Figure 4A:
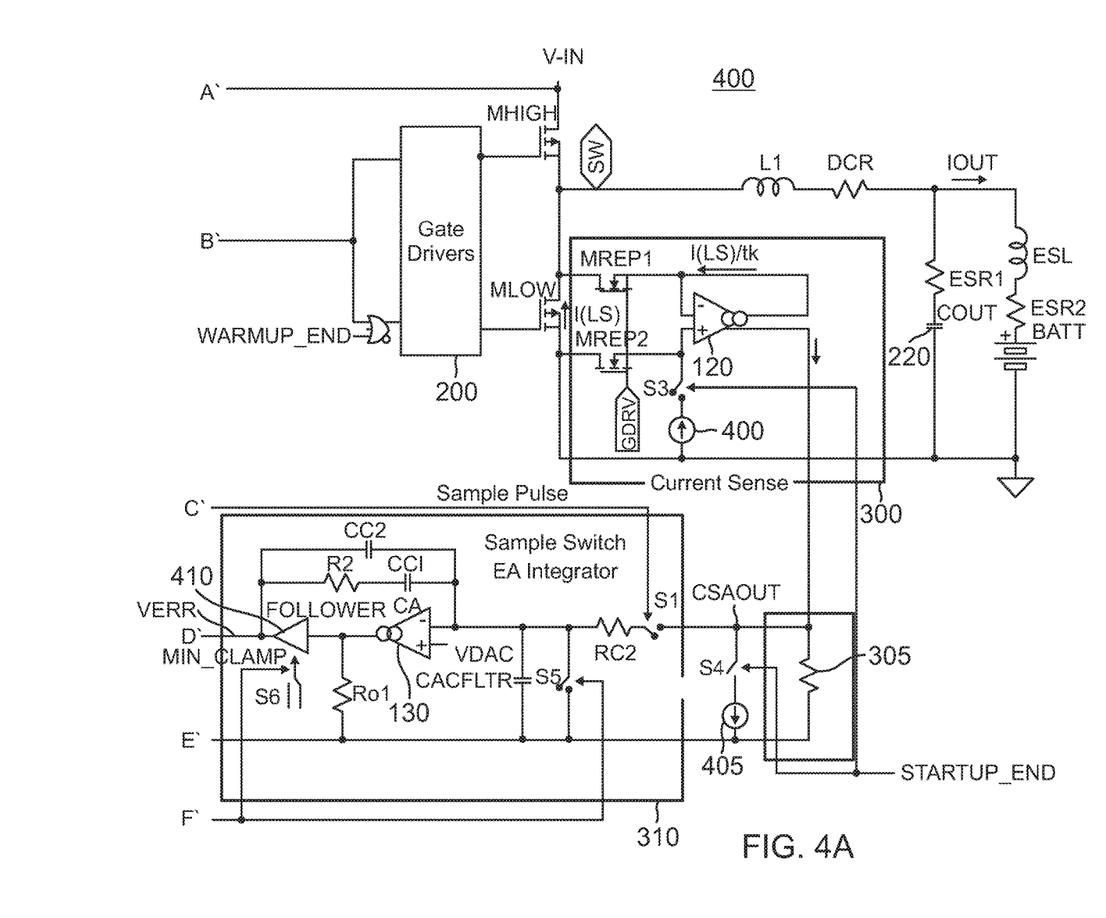
FIGS. 4A and 4B are more detailed circuit diagrams of the buck converter of FIGS. 3A and 3B.
Figure 4B:
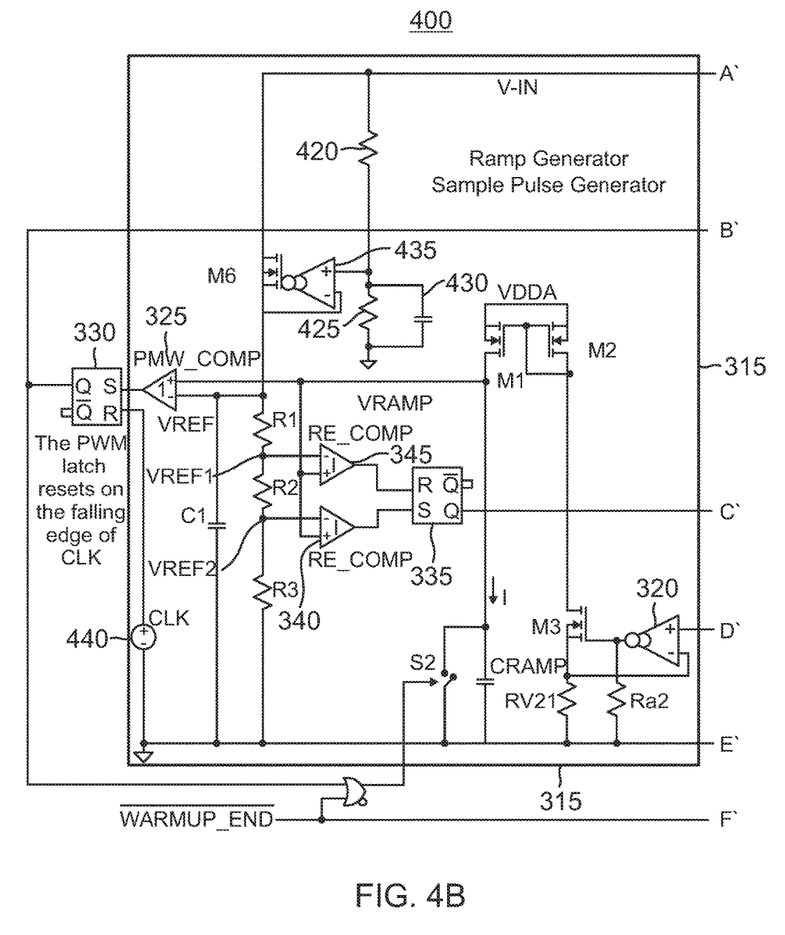

An example buck converter 400 is shown in more detail in FIG. 4A and FIG. 4B. The signal connections between FIG. 4A and FIG. 4B are denoted by the letters A', B', C', D', E', and F'. Buck converter 400 is substantially the same as discussed with regard to buck converter 100. Thus, only the additional details for buck converter 400 will be discussed further. For example, current sense circuit 300 may include a current source 400 that drives the positive input of CSA 120 when a switch S3 is closed as controlled by a complement of a STARTUP_END signal. Current source 400 may be used when measuring a negative inductor current (a current that flows from inductor L1 into node LX). The complement of the STARTUP_END signal may also control a switch S4 to bias the node carrying the output voltage CSAOUT with a current from a current source 405.

Sample switch EA integrator circuit 310 in buck converter 400 includes a shorting switch S5 that may short the negative input to EA 120. In addition, the negative input to EA 130 may be smoothed through a capacitor CACFLTR that couples between the negative input and ground. A follower amplifier 410 buffers the output of EA 130 to form error voltage VERR, which may be clamped at a minimum voltage selected by a switch S6. A resistor R01 loads the input to follower amplifier 410.

In ramp generator and switch generator circuit 315, V-to-I amplifier 320 drives the ramp capacitor through a current mirror formed by NMOS transistors M1 and M2. When the output of V-to-I amplifier 320 goes high, it switches on an NMOS switch transistor M3. Current then flows through transistor M2, which is mirror by transistor to cause the ramp voltage VRAMP to build on the ramp capacitor CRAMP. V-to-I amplifier compares a voltage across a resistor RV21 in series with transistor M3 to the error voltage VERR to form its output signal across a resistor R02.

The reference voltage VREF formed across the serial combination of resistors R1, R2, and R3 is supplied by the input voltage V_IN through an NMOS transistor M6 that compares the reference voltage VREF to a divided version of the input voltage formed across a resistor 425 in parallel with a capacitor 430 and in series with a resistor 420. An amplifier 435 compares VREF and the divided version of the input voltage to control transistor M6 accordingly.

Figure 5:
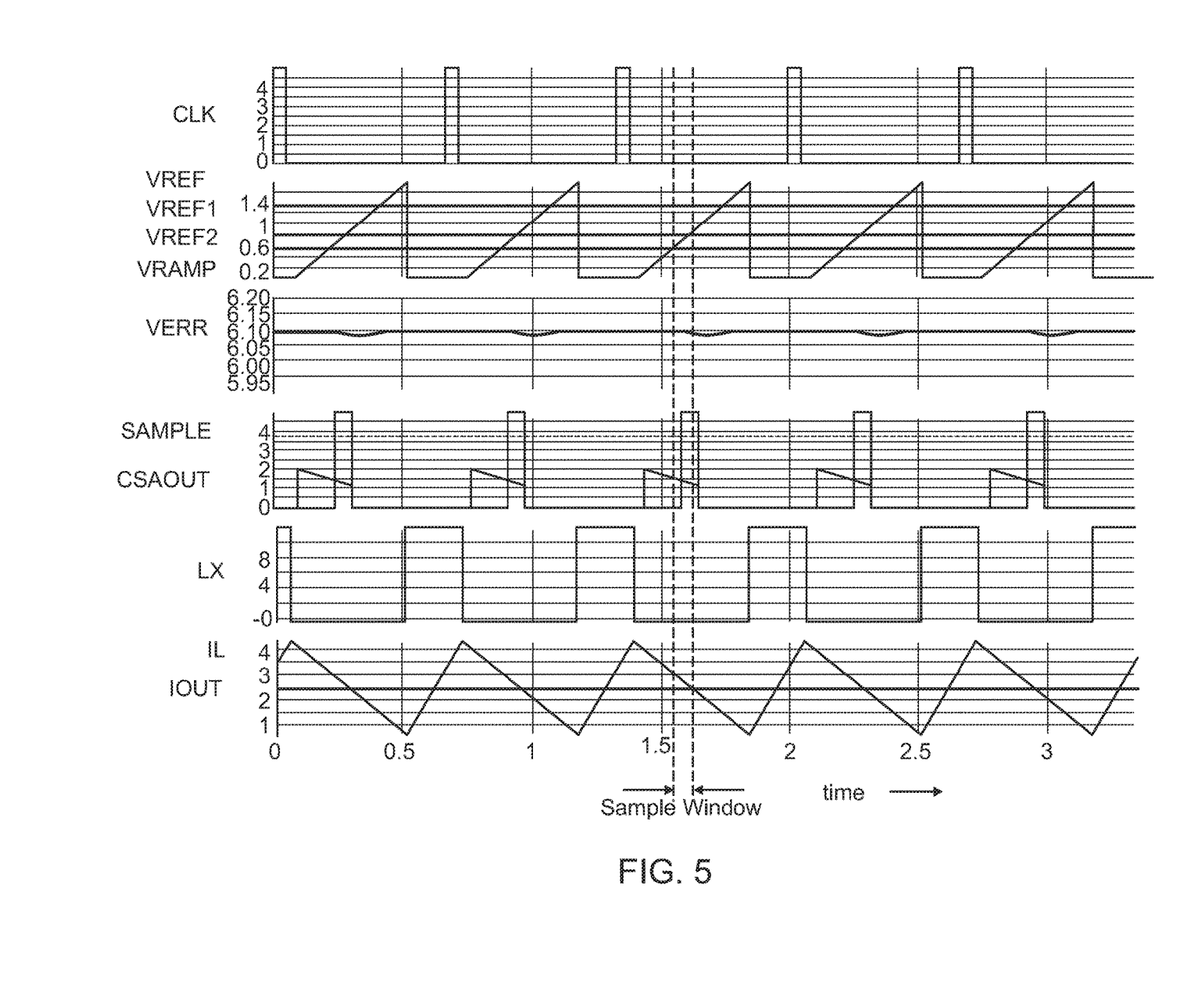
FIG. 5 illustrates waveforms for the buck converter of FIGS. 3A, 3AB, 4A, and 4B.
Figure 6:
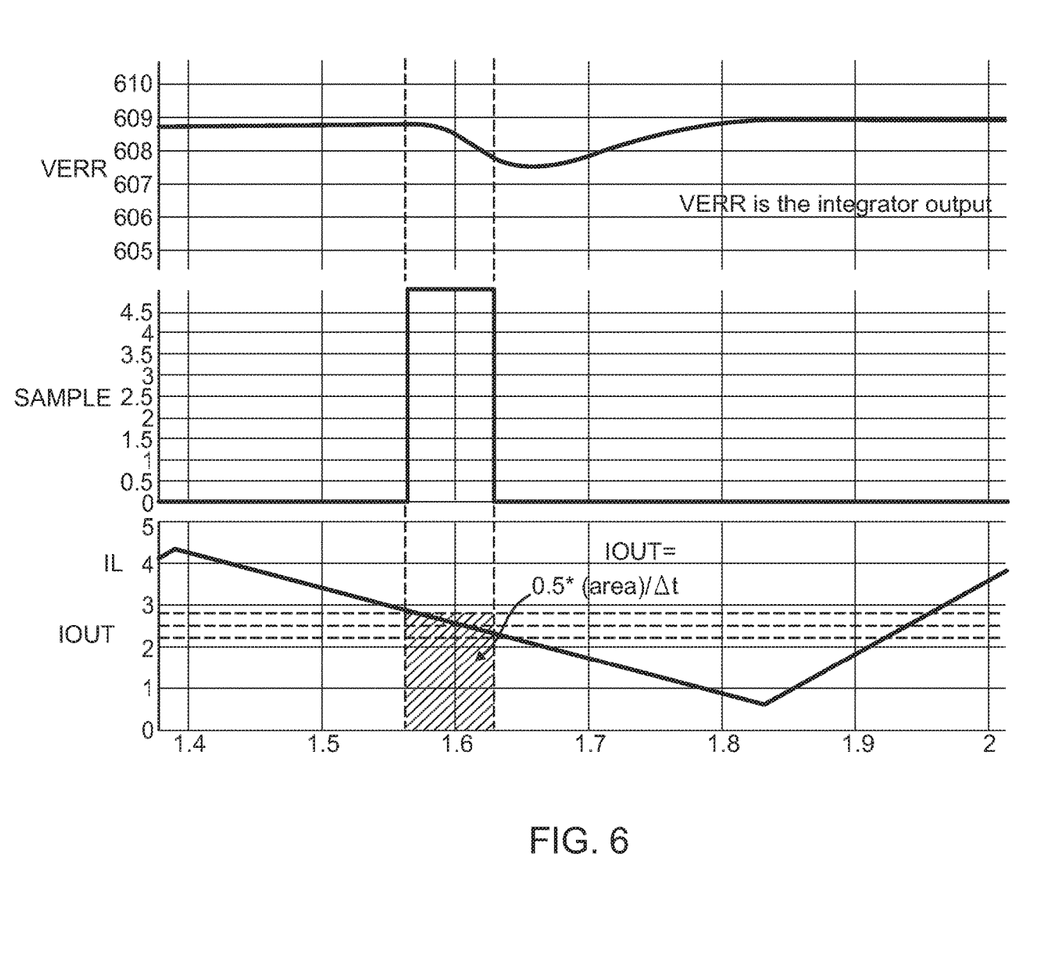
FIG. 6 is a close up view for one cycle of the error voltage VERR, the SAMPLE signal, and the inductor current shown in in FIG. 5.

The timing diagram shown in FIG. 5 illustrates the behavior of a number of signals for buck converter 400 (or buck converter 100). In particular, note that as the ramp voltage VRAMP rises sequentially past VREF2, the rising edge of the SAMPLE signal is triggered. Similarly, the falling edge of the SAMPLE signal is triggered by the ramp voltage rising past VREF1. The result is that the sampling window is centered about the average inductor current IOUT. This is shown in greater detail in FIG. 6. In particular, the inductor current IL during the sample window is shaded in FIG. 6. The average inductor current IOUT equals one half of the shaded area as divided by the sampling window period.

Those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A buck converter controller integrated circuit comprising:
  a replica circuit including a replica transistor and a current sense amplifier, wherein the current sense amplifier is configured to drive the replica transistor with a first replica current equaling a scaled version of a current through a low-side switch transistor, and wherein the current sense amplifier is further configured to output a second replica current equaling another scaled version of the current through the low-side switch transistor;
  a sample switch configured to sample the second replica current during a sampling window to produce a sampled signal;
  an error amplifier configured to compare the sampled signal to a first reference signal to generate an error signal during the sampling window; and
  a controller configured to control a cycling of a high-side switch transistor and the low-side switch transistor responsive to the error signal,
  wherein the sample switch is disposed between the current sense amplifier and the error amplifier such that when the sample switch is open, the sampled signal is held at the error amplifier for the error signal.

2. The buck converter controller integrated circuit of claim 1, wherein the replica transistor is a first replica transistor having a drain coupled to a drain of the low-side switch transistor and having a source coupled to a first input of the current sense amplifier, and wherein the replica circuit further includes a second replica transistor coupled between a source of the low-side switch transistor and a second input of the current sense amplifier, wherein the current sense amplifier is configured to compare the first input of the current sense amplifier and the second input of the current sense amplifier.

3. The buck converter controller integrated circuit of claim 2, wherein a first output of the current sense amplifier is coupled to the source of the first replica transistor, and the wherein current sense amplifier is further configured to output the second replica current on a second output of the current sense amplifier.

4. The buck converter controller integrated circuit of claim 1, wherein the reference signal is a reference voltage and the error signal is an error voltage, the buck converter controller integrated circuit further comprising:

a temperature-compensated resistor configured to receive the second replica current to generate a voltage, wherein the error amplifier is configured to compare the voltage to the reference voltage to generate the error voltage.

5. The buck converter controller integrated circuit of claim 4, wherein the error amplifier is an integrator error amplifier configured to integrate the error voltage during the sampling window.

6. The buck converter controller integrated circuit of claim 4, further comprising:
a voltage-to-current amplifier configured to translate the error voltage into a ramp current; and
a ramp capacitor configured to generate a ramp voltage responsive to the ramp current.

7. The buck converter controller integrated circuit of claim 6, further comprising:
a pulse-width-modulator (PWM) latch;
a PWM comparator configured to compare the ramp voltage to a first reference voltage VREF to generate a set signal for the PWM latch;
a falling edge comparator configured to compare the ramp voltage to a first divided version of a reference voltage VREF to terminate the sampling window;
a rising edge comparator configured to compare the ramp voltage to a second divided version of the reference voltage VREF to begin the sampling window, wherein the first divided version of the reference voltage VREF is greater than the second divided version of the reference voltage VREF.

8. The buck converter controller integrated circuit of claim 7, further comprising:
a shorting switch configured to ground the ramp voltage responsive to a true data output signal from the PWM latch.

9. The buck converter controller integrated circuit of claim 7, wherein the PWM latch is configured to be reset responsive to a clock signal, wherein the PWM latch is configured to command the high-side switch transistor to be cycled on while the PWM latch is set and to command the high-side switch transistor to be cycled off while the PWM latch is reset.

10. A method of controlling a buck converter, comprising:
replicating a current through a low-side switch transistor through a replica transistor to generate a scaled replica current of the current through the low-side switch transistor;
sampling the scaled replica current during a sampling window, wherein the sampling window occurs during an on time for the low-side switch transistor to generate a sampled signal;
holding the sampled signal at an error amplifier by opening a sample switch disposed between a current sense amplifier and the error amplifier;
comparing the held signal to a reference signal to generate an error signal; and
controlling an on time of a high-side switch transistor and the on time of the low-side switch transistor responsive to the error signal.

11. The method of claim 10, wherein replicating the current through the low-side switch transistor through the replica transistor to generate the scaled replica current of the current through the low-side switch transistor comprises driving the low-side switch transistor responsive to feedback from a current sense amplifier to force the replica transistor to have a drain-to-source voltage equaling a drain-to-source voltage for the low-side switch transistor and to have a gate-to-source voltage equaling a gate-to-source voltage for the low-side switch transistor.

12. The method of claim 10, wherein sampling the scaled replica current during the sampling window comprises sampling a voltage derived from the scaled replica current during the sampling window to generate a sampled signal voltage; and wherein comparing the held signal to the reference signal to generate the error signal comprises comparing the held signal voltage to a reference voltage to generate an error voltage.

13. The method of claim 12, further comprising:
integrating the error voltage during the sampling window.

14. The method of claim 12, further comprising:
converting the error voltage into an error current;
charging a ramp capacitor with the error current to generate a ramp voltage;
comparing the ramp voltage to a reference voltage VREF to generate a set signal when the ramp voltage equals the reference voltage VREF;
setting a pulse width modulator (PWM) latch responsive to the set signal; and
resetting the PWM latch responsive to a clock signal.

15. The method of claim 14, further comprising:
driving a high-side switch transistor on while the PWM latch is set; and
driving the low-side switch transistor on while the PWM latch is reset.

* * * * *